United States Patent [19]
Groeneveld

[11] Patent Number: 5,089,718
[45] Date of Patent: Feb. 18, 1992

[54] DYNAMIC CURRENT DIVIDER CIRCUIT WITH CURRENT MEMORY

[75] Inventor: Dirk W. J. Groeneveld, Eindhoven, Netherlands

[73] Assignee: U.S. Philips Corp., New York, N.Y.

[21] Appl. No.: 657,712

[22] Filed: Feb. 19, 1991

[30] Foreign Application Priority Data

Feb. 26, 1990 [NL] Netherlands ............... 9000450

[51] Int. Cl.$^5$ .................................................. H03K 17/56
[52] U.S. Cl. ........................................ 307/244; 307/255;
307/296.6; 307/584; 307/270
[58] Field of Search .................... 307/244, 255, 296.6,
307/571, 584, 270, 353

[56] References Cited

U.S. PATENT DOCUMENTS

| | | | |
|---|---|---|---|
| 3,839,648 | 10/1974 | Pace | 307/492 |
| 3,986,051 | 10/1976 | Okada et al. | 307/254 |
| 4,112,315 | 9/1978 | Ohhinata | 307/254 |
| 4,349,750 | 9/1982 | Geurts | 307/244 |
| 4,590,433 | 5/1986 | Kusakabe | 307/254 |
| 4,958,123 | 9/1990 | Hughes | 307/353 |
| 4,973,978 | 11/1990 | Jordan | 328/129.1 |
| 5,012,133 | 4/1991 | Hughes | 307/353 |
| 5,021,692 | 6/1991 | Hughes | 307/353 |

Primary Examiner—John S. Heyman
Assistant Examiner—Terry D. Cunningham
Attorney, Agent, or Firm—Steven R. Biren

[57] ABSTRACT

Dynamic accurate current divider which comprises current memory circuits (M2-C1-S3, M3-C2-S4) by means of which an input current (Iin) to be split up is divided into two almost equally large output currents (Iout1, Iout2). Under the control of a clock generator (9) having two-phase switching cycles, any inequalities in the output currents are equalized by means of the current memory circuits in a number of cycles of the clock generator.

6 Claims, 4 Drawing Sheets

DYNAMIC CURRENT DIVIDER CIRCUIT WITH CURRENT MEMORY

BACKGROUND OF THE INVENTION

The invention relates to a current divider for splitting up an input current into substantially equal output currents, comprising:
an input terminal for connecting the input current,
first and second output terminals for tapping the output currents,
current branches for coupling the input terminal and the output terminals to respective connecting terminals,
switching means for coupling the connecting terminals in a switching cycle under the control of switching signals,
current memory circuits inserted in at least one of the current branches, each circuit comprising first and second current terminals and a control terminal, for maintaining with a first control signal level on the control terminal a current flowing through the first and second current terminals during a second level of the control signal and
a clock generator for generating the switching signals for the switching means and the control signals for the current memory circuits.

A similar current divider is known from the article entitled "Very accurate current divider", Electronics Letters, 6 July 1989, Vol. 25, No. 14.

Current dividers are used, for example, in digital-to-analog converters in which a reference current is divided by means of a plurality of current dividers into a binary weighted series of currents which are connected to a junction point by means of switches in response to the bit values of a digital to be converted. With an augmenting number of bits ever more strict requirements are made on the accuracy of the current dividers. In static current dividers the attainable accuracy is restricted by tolerances in the manufacturing and design process of the components used.

The known current divider comprising CMOS transistors is of the dynamic type, in which the accuracy of the current division is substantially insensitive to the tolerances in the manufacturing and design process of the transistors used. The input current to be divided is distributed according to a cyclic switching pattern over a number of current branches comprising current memory circuits by means of the switching means controlled by switching signals. In dependence on the level of the control signals the current memory circuits operate as current consumer or current supplier, the supplied current being substantially equal to the previously consumed current. A clock generator supplies switch and control signals which are selected such that irrespective of the initial distribution of the current over the current branches, the currents through specific current branches converge to final values which are about half the input current. These currents form the output currents of the current divider.

A detrimental effect of the known current divider is that the output currents are available only during part of the cycle period of the switching pattern, which impedes the use of this divider in digital-to-analog converters which require continuously flowing currents.

SUMMARY OF THE INVENTION

It is an object of the present invention to provide a dynamic current divider having continuously available output currents.

Therefore, a current divider according to the invention of the type described above is characterized in that:
the input terminal is coupled through a first and a second current branch to a first and a second connecting terminal respectively, the first current branch comprising a first variable current source for supplying a current which is the difference between the input current and a current flowing through the second current branch, and the second current branch comprising a first current memory circuit whose first current terminal is coupled to the input terminal and whose second current terminal is coupled to the second connecting terminal,
the first and second output terminals are coupled through third and fourth current branches respectively, to third and fourth connecting terminals, the third current branch comprising a second current memory circuit whose first current terminal is coupled to the first output terminal and whose second current terminal is coupled to the third connecting terminal,
the switching means are arranged for coupling during a first phase of the switching cycle the first to the third connecting terminal and the second to the fourth connecting terminal and for coupling during a second phase of the switching cycle the first to the fourth connecting terminal and the second to the third connecting terminal, and
the clock generator is arranged for generating control signals which are coupled to respective control terminals of the first and second current memory circuits, the control signal for the control terminal of the first and the second current memory circuit respectively, assuming a value which corresponds to the first and the second level respectively, during at least part of the first phase of the switching cycle and corresponds to the second and the first level respectively, during at least part of the second phase of the switching cycle.

In this configuration the input current is divided over the first and second current branches. During the first phase of the switching cycle the switching means couple the first current branch to the first output terminal through the third current branch and couple the second current branch to the second output terminal through the fourth current branch. The first current memory circuit in the second current branch is then arranged as a current supplier whose supplied current is available on the second output terminal through the fourth current branch. The variable current source in the first current branch delivers a current to the third current branch which current is equal to the difference between the input current and the current flowing through the second current branch. The current memory circuit included in the third current branch acts as a current consumer for the current supplied by the variable current source and passes this current to the first output terminal.

During the second phase of the switching cycle the switching means couple the first current branch to the fourth current branch and the second current branch to the third current branch, the first and second current memory circuits being changed over so that the first branch now acts as a current consumer and the second branch as a current supplier. The current flowing through the first and third current branches during the first phase now flows through the second and third current branches during the second phase. A current which is the difference between the input current and the new current through the second branch now flows through the first and fourth current branches.

Subsequent thereto, the first phase of the switching cycle is repeated. Since the proportion between the consumed and supplied powers of the current memory circuits is never exactly equal to unity, the originally unequal currents flowing through the first and second current branches will converge after a number of cycles to final values which are substantially equal to half the input current. Since the switching means connect the first and second current branches either directly or cross-wise to the first and second output terminals during both phases of the switching cycle, the output currents are continuously available.

A further advantage of the current divider according to the invention is that the switching cycle has only two phases due to which the clock generator has a simpler structure than the prior-art current divider which operates with three phases.

A further embodiment of a current divider according to the invention is characterized in that in the second current branch a second variable current source for supplying a current proportional to the current of the first variable current source is connected in parallel to the first current memory circuit.

The second variable current source in the second current branch in conjunction with the first variable current source in the first current branch forms a static current divider whose dividing factor is determined by the proportionality factor of the currents. The dynamic controller of the current divider now acts only on the possible difference between the currents in the first and second variable current sources and may be considered a fine adjustment of the static current division. Consequently, the current divider has a more accurate operation when reaching the final values of the currents through the current branches.

A further embodiment of a current divider according to the invention is characterized in that the first and second current memory circuits each comprise:

a transistor having a control electrode and having first and second main electrodes coupled to the first and second current terminals respectively, the transistor of the first current memory circuit being of a first conductivity type and the transistor of the second current memory circuit being of a second conductivity type opposite to the first conductivity type, a hold-capacitor connected between the control electrode and the first main electrode and a switch between the control electrode and the second main electrode, which is open with the first level of the control signal and closed with the second level of the control signal, and is further characterized in that the first variable current source comprises a transistor of the first conductivity type having first and second main electrodes and a control electrode which are coupled to the input terminal, the first connecting terminal and a reference voltage terminal respectively.

In this embodiment the current memory circuits are designed in a mutually complementary arrangement. When the switch is closed, the transistor is arranged as a diode and across the hold-capacitor a voltage is built up which is a criterion for the current impressed through the transistor. When the switch is open, the transistor acts as a current source whose strength, as a result of the storing operation of the hold-capacitor, is substantially equal to the previously impressed current.

The first variable current source in the first current branch comprises a transistor whose control electrode is maintained at a fixed voltage. The voltage difference between the first main electrode and the control electrode of this transistor continuously adjusts itself to a value which is necessary for enabling a current to flow which current is equal to the difference between the input current and the current flowing through the second current branch.

Another embodiment of a current divider according to the invention is characterized in that the fourth current branch comprises a transistor of the second conductivity type, first and second main electrodes of which transistor being coupled to the second output terminal and the fourth connecting terminal respectively, and a control electrode being coupled to the second main electrode.

When the final values of the currents through the current branches are reached, the transistor in the fourth current branch provides a better matching of the voltages on the second main electrode of the transistor of the second current memory circuit during the first and second phases of the switching cycle. This enhances the matching of the current consumed and supplied by the second current memory circuit and hence the accuracy of the current divider.

Again another embodiment of a current divider according to the invention is characterized in that the second variable current source comprises a transistor of the first conductivity type having first and second main electrodes which are connected to the respective first and second main electrodes of the transistor of the first current memory circuit and having a control electrode connected to the control electrode of the transistor of the first variable current source.

The proportionality factor of the currents of the first and second variable current sources are in this case determined by transistor dimensions of the transistors used in the variable current sources.

BRIEF DESCRIPTION OF THE DRAWINGS

The invention will now be further explained with reference to the appended drawing, in which.

Figure 1A:
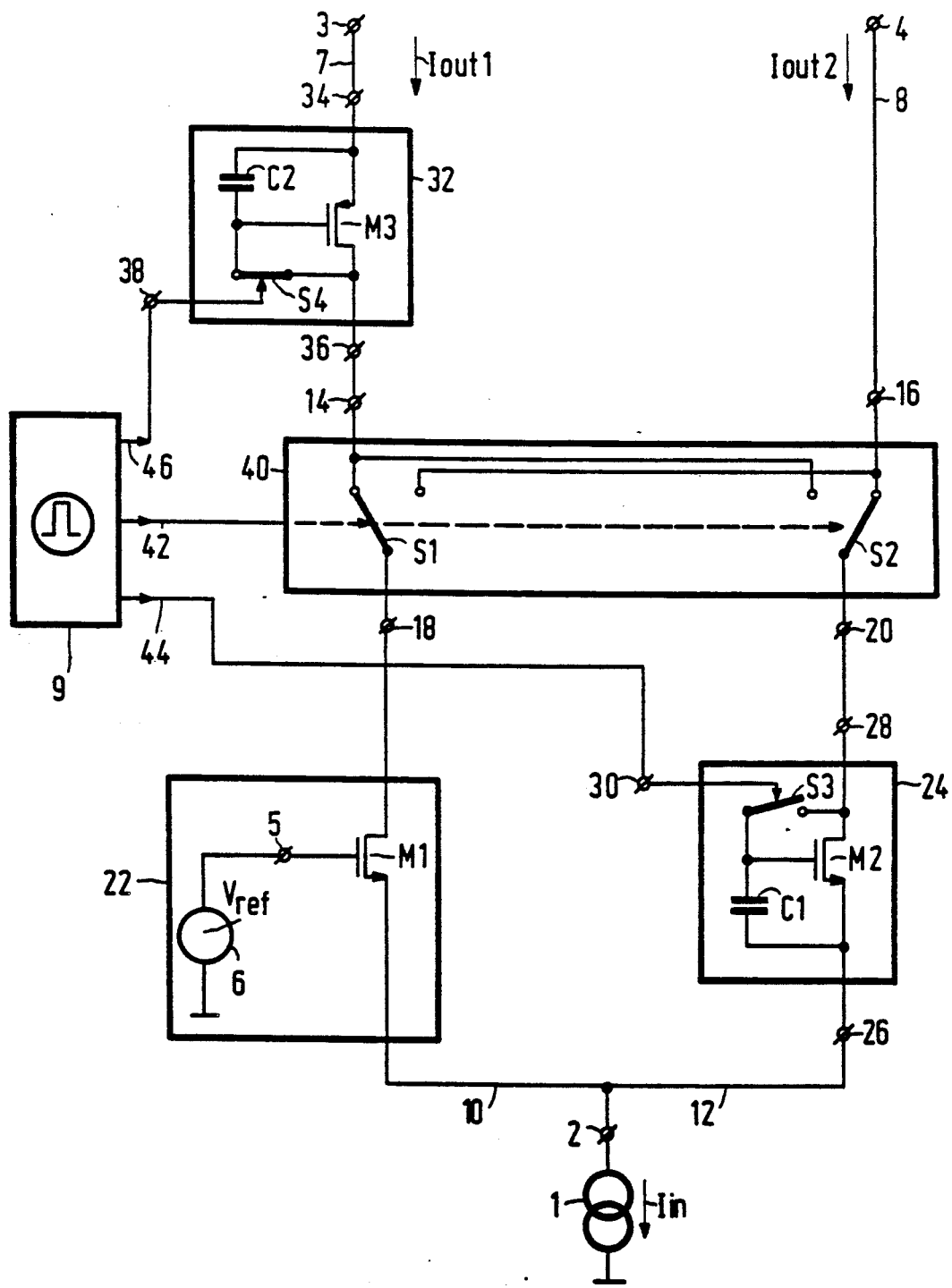
FIGS. 1a and 1b show a first embodiment of a current divider according to the invention in two different operational modes.

In the FIGS. 1a, 1b, 2 and 3, equivalent components are denoted by equivalent reference characters.

DESCRIPTION OF THE PREFERRED EMBODIMENTS

FIG. 1 shows a first embodiment of a current divider according to the invention. The transistors shown are of the field-effect type in which the control electrode, the first main electrode and the second main electrode correspond to the respective gate, source and drain of the field-effect transistors. The input current Iin to be distributed from current source 1 is connected to an input terminal 2 of the current divider and divides through a first current branch 10 which comprises a variable current source 22, to a first connecting terminal 18 and through a second current branch 12 which comprises a first current memory circuit 24, to a second connecting terminal 20. The partial currents Iout1 and Iout2 flow respectively, through a third current branch 7 from a first output terminal 3 to a third connecting terminal 14 and through a fourth current branch 8 from a second output terminal 4 to a fourth connecting terminal 16. Current branch 7 comprises a second current memory circuit 32. Current branch 8 establishes a direct connection between the output terminal 4 and connecting terminal 16.

The connecting terminals 14, 16, 18 and 20 of the four current branches 7, 8, 10 and 12 are interconnected through switching means 40 which are arranged as a change-over switch S1 which couples the connecting terminal 18 to connecting terminal 14 or connecting terminal 16, and a change-over switch S2 which couples the connecting terminal 20 to connecting terminal 16 or connecting terminal 14. The change-over switches S1 and S2 are operated by a switching signal 42 originating from a clock generator 9.

The variable current source 22 comprises a transistor M1 of a first conductivity type, whose source is coupled to input terminal 2 and whose drain is coupled to connecting terminal 18. The gate of transistor M1 is connected to a reference voltage terminal 5 to which a reference voltage source 6 is connected. The input current source and the reference voltage source 6 are further connected to a suitably selected point having a fixed potential for which purpose ground has been chosen here by way of example.

The first current memory circuit 24 comprises a transistor M2 of the first conductivity type, whose source and drain are connected to a first current terminal 26 and a second current terminal 28 respectively, which in turn are coupled to the input terminal 2 and connecting terminal 20 respectively. A hold-capacitor C1 which, for that matter, may also be formed by an internal gate-source capacitance of the transistor M2, is arranged across the gate and source of transistor M2. The current memory circuit 24 further includes a switch S3 connected between the drain and the gate of transistor M2 and is operated by a control signal 44 from the clock generator 9 arriving at control terminal 30. If the switch S3 is closed, transistor M2 will be arranged as a diode and a current impressed to transistor M2 from elsewhere will cause a voltage difference across hold-capacitor C1 to be maintained after the switch S3 has been opened. Transistor M2 will then operate as a current source whose delivered current is substantially equal to the previously impressed current.

The second current memory circuit 32, whose operation is identical with that of the first current memory circuit 24, comprises a transistor M3 of a second conductivity type which is the opposite to the first conductivity type. The source and drain of transistor M3 are connected to the respective first and second current terminals 34 and 36 coupled to the output terminal 3 and the connecting terminal 14 respectively. The current memory circuit 32 further includes a hold-capacitor C2 and a switch S4 connected in a manner similar to that of current memory circuit 24. Switch S4 is operated by a control signal 46 from clock generator 9 which arrives at a control terminal 38 of current memory circuit 32.

Figure 1B:
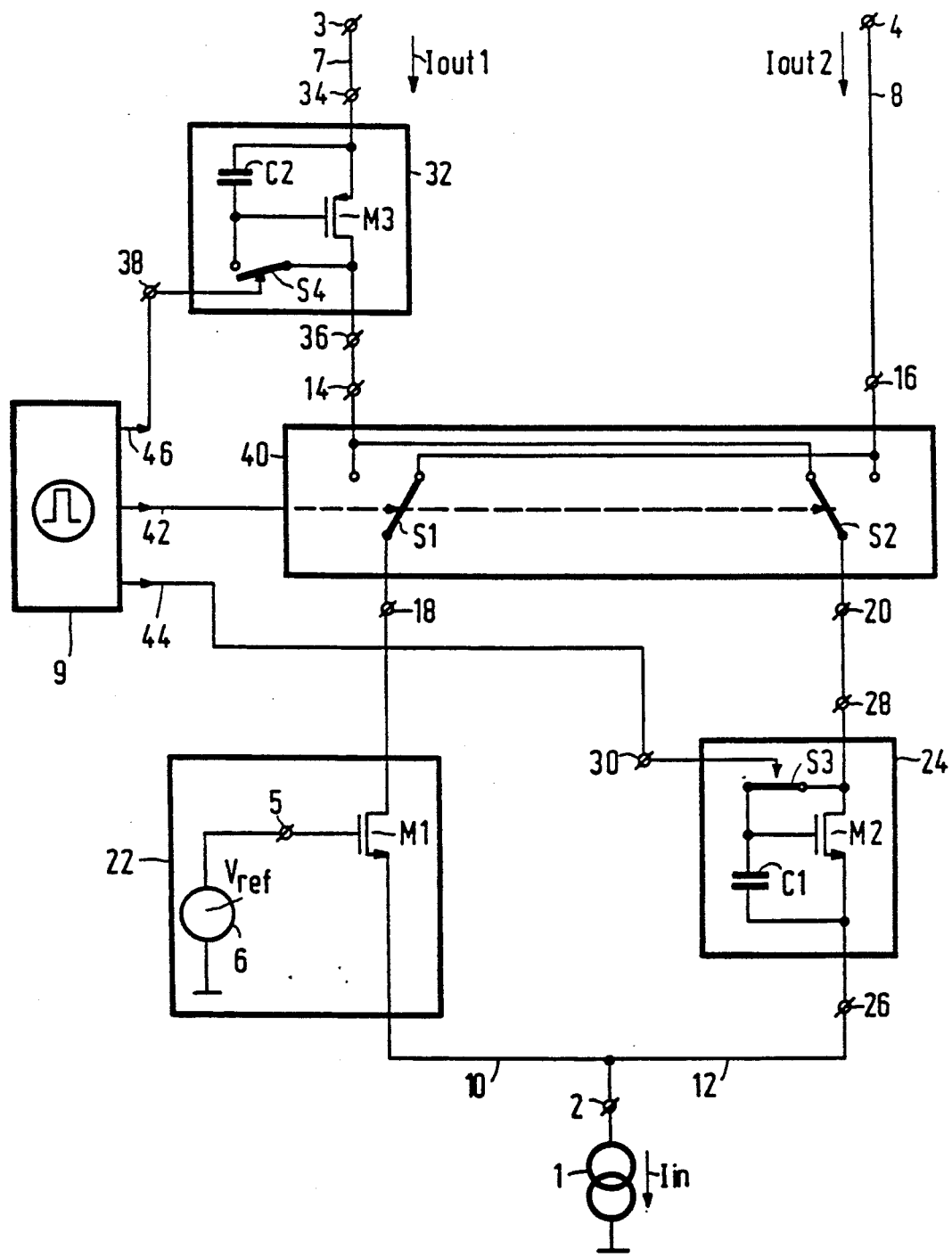

The clock generator 9 controls the switches S1...S4 in a two-phase switching cycle. FIG. 1a shows the switches in the state assumed during the first phase of the switching cycle. Switch S1 couples connecting terminal 18 to connecting terminal 14, switch S2 couples connecting terminal 20 to connecting terminal 16, whereas switch S3 is open switch S4 is closed. The states of the switches during the second phase of the switching cycle are shown in FIG. 1b. Switch S1 now couples connecting terminal 18 to connecting terminal 16, switch S2 couples connecting terminal 20 to connecting terminal 14 whilst switch S3 is closed and S4 is open.

The operation of the current divider is as follows. During the first phase of the switching cycle the third transistor M3 is arranged as a diode and the second transistor as a current source, as is represented in FIG. 1a. Furthermore, the transistor M3 and the transistor M1 are connected in series between the output terminal 3 and the input terminal 2 and the transistor M2 is inserted between the second output terminal 4 and the input terminal 2. Assuming that initially the voltage across the hold-capacitor C1 is still zero, the input current Iin of current source 1 will completely flow through transistor M1, because the gate-source voltage of transistor M2 is zero Volts. Across the hold-capacitor C2 a voltage corresponding with the current Iin through transistor M3 adjusts itself. In output terminal 3 a current Iout1 flows which is equal to Iin. In output terminal 4 a current Iout2 flows which is equal to zero. During the second phase of the switching cycle all switches are changed, as is represented in FIG. 1b. The current Iin through the transistor M3, now acting as a current source, flows through the transistor M2 arranged as a diode while a voltage corresponding to the current through transistor M2 is built up across the hold-capacitor C1. The current Iout1 remains equal to Iin and the current Iout2 remains equal to zero, but the currents through the transistors M1 and M2 are exchanged. During the first phase of the next period of the switching cycle the exchanged currents through transistors M1 and M2 are again directly connected to the output terminals 3 and 4, so that a current Iout1=0 flows through output terminal 3 and a current Iout2=-Iin flows through output terminal 4. The values of the currents Iout1 and Iout2 are thus exchanged after each second phase, whereas the sum of the currents Iout1 and Iout2 remains equal to the input current Iin. Since the proportional number of the current impressed to the transistor M3 during the first phase to the current supplied by the transistor M3 during the second phase is never exactly equal to unity, the exchanging of the currents will be accompanied with a slight loss. Consequently, the value of the one current which initially was equal to Iin will finally decrease and, because the sum of the currents remains constant, the value of the other current will increase from the initial value of zero. A similar process will take place if the exchanging of the currents is accompanied with a slight amplification. Irrespective of the initial distribution of the input current Iin over the transistors M1 and M2, the values of the currents Iout1 and Iout2 will converge to each other after a number of periods of the clock signal and will both reach a final value which is substantially equal to half the input current Iin. The accuracy of the mutual equality is determined by the conversion from impressed current to supplied current in transistor M3.

Figure 2:
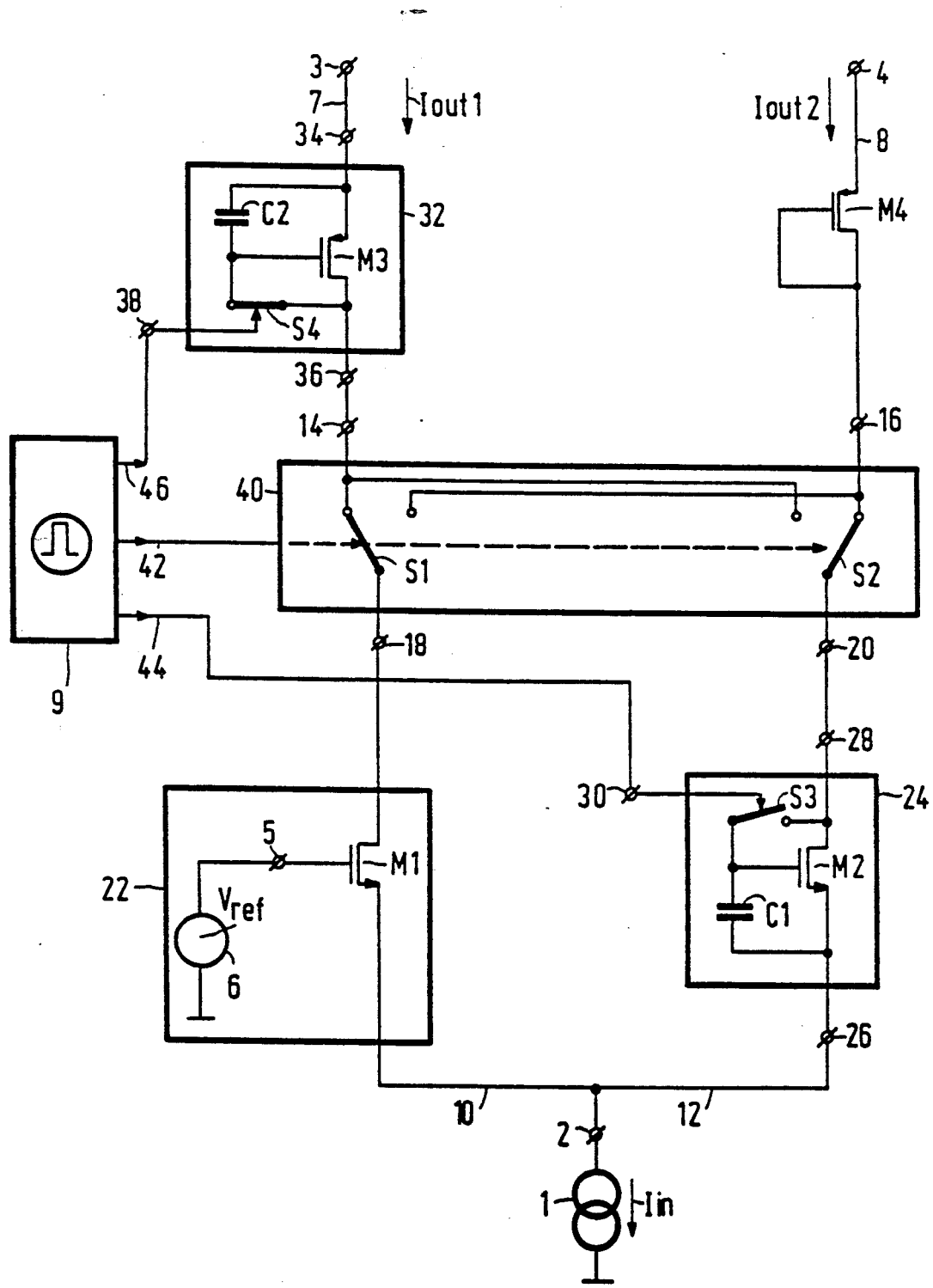
FIG. 2 shows a second embodiment of a current divider according to the invention.

FIG. 2 shows a second embodiment of a current divider according to the invention. The current branch 8 comprises a fourth transistor M4 arranged as a diode, which transistor has the same conductivity type and about the same dimensions as the third transistor M3. The source is connected to output terminal 4 and the interconnected gate and drain to connecting terminal 16. The fourth transistor M4 provides that when the final situation is reached the voltages on the drains of transistor M1 and transistor M2 are substantially equal, assuming that the potentials on the first and second output terminals 3, 4 are equal. The drain voltage of transistor M3 will then hardly change any longer during the first and second phases of the switching cycle, which will benefit the accuracy of the current divider.

Figure 3:
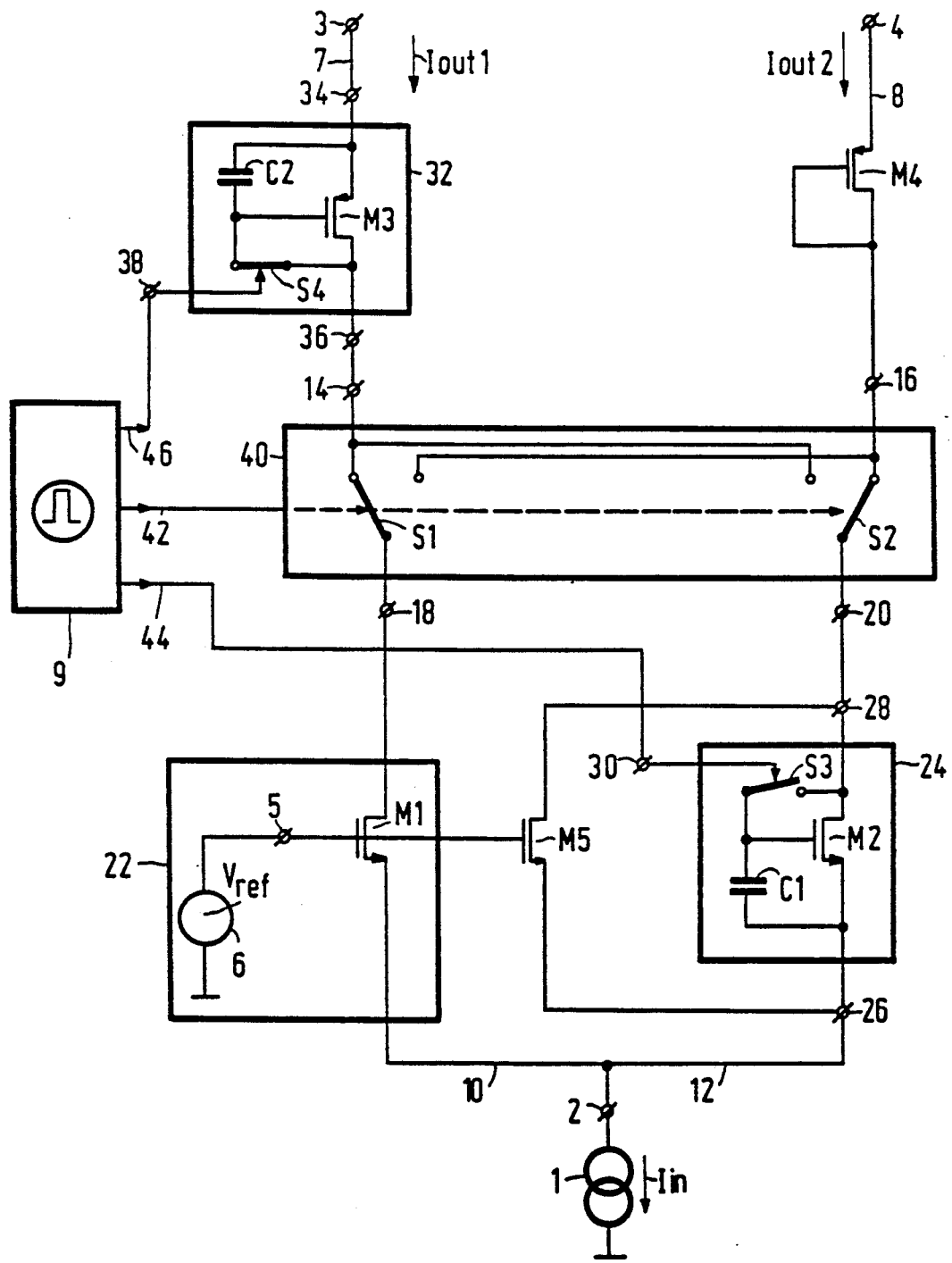
FIG. 3 shows a third embodiment of a current divider according to the invention.

FIG. 3 shows a third embodiment of a current divider according to the invention. A similar fifth transistor M5, whose source and drain are connected to the corresponding electrodes of transistor M2 and whose gate is connected to the reference voltage terminal 5, is arranged in parallel to the transistor M2. Transistor M5, like transistor M1, is arranged as a variable current source and provides a current which is proportional to that of transistor M1. The proportionality is determined by the dimensions of the transistors M1 and M5. The transistors M1 and M5 together form a static current divider which divides the input current Iin into two parts of which the proportion is determined by the dimensions of the transistors M1 and M5. The current divider now only needs to provide a dynamic control of the difference between the currents through transistors M1 and M5. This too will benefit the accuracy of the current divider. It will be evident that in the embodiment as shown in FIG. 3 the fourth transistor M4 may also be omitted.

The switches may further be arranged in a conventional manner, for example, by means of switching transistors in MOS or CMOS technology. The exemplary embodiments shown are arranged in MOS transistors, but bipolar transistors or Darlington transistors are likewise possible. The values of the first and second hold-capacitors C1, C2 are not critical. The gate-source capacitance of the transistors concerned may also be used as hold-capacitors. In order to increase the output impedance of variable current source 22, one or a plurality of transistors may be cascoded in series with the drain of transistor M1.

I claim:

1. A current divider for splitting up an input current into substantially equal output currents, comprising:
    an input terminal for connecting the input current;
    first and second output terminals for tapping the output currents;
    switching means operating in response to switching signals;
    first and second current memory circuits, each circuit comprising first and second current terminals and a control terminal, for maintaining a current flowing through the first and second current terminals during a first control signal level on the control terminal to also flow during a second level of the control signal; and
    a clock generator for generating the switching signals for the switching means and the control signals for the current memory circuits, characterized in that:
    the input terminal is coupled through a first and a second current branch to a first and a second connecting terminal, respectively, the first current branch comprising a first variable current source for supplying a current which is the difference between the input current and a current flowing through the second current branch, and the second current branch comprising the first current memory circuit whose first current terminal is coupled to the input terminal and whose second current terminal is coupled to the second connecting terminal;
    the first and second output terminals are coupled through third and fourth current branches, respectively, to third and fourth connecting terminals, the third current branch comprising the second current memory circuit whose first current terminal is coupled to the first output terminal and whose second current terminal is coupled to the third connecting terminal;
    the switching means couple, during a first phase of the switching cycle, the first to the third connecting terminal and the second to the fourth connecting terminal and couple, during a second phase of the switching cycle, the first to the fourth connecting terminal and the second to the third connecting terminal; and
    the clock generator generates said control signals which are coupled to respective control terminals of the first and second current memory circuits, the control signal for the control terminal of the first and the second current memory circuit, respectively, assuming a value which corresponds to the first and the second level, respectively, during at least part of the first phase of the switching cycle and corresponds to the second and the first level, respectively, during at least part of the second phase of the switching cycle.

2. Current divider as claimed in claim 1, characterized in that in the second current branch a second variable current source for supplying a current proportional to the current of the first variable current source is connected in parallel to the first current memory circuit.

3. Current divider as claimed in claim 1, characterized in that the first and second current memory circuits each comprise:
    a transistor having a control electrode and having first and second main electrodes coupled to the first and second current terminals respectively, the transistor of the first current memory circuit being of a first conductivity type and the transistor of the second current memory circuit being of a second conductivity type opposite to the first conductivity type;
    a hold-capacitor connected between the control electrode and the first main electrode; and
    a switch connected between the control electrode and the second main electrode which is open during the first level of the control signal and closed with the second level of the control signal.

4. Current divider as claimed in claim 2, characterized in that the first variable current source comprises a transistor of a first conductivity type having first and second main electrodes and a control electrode which are coupled to the input terminal, the first connecting terminal and a reference voltage terminal, respectively.

5. Current divider as claimed in claim 2, characterized in that the fourth current branch comprises a transistor of a second conductivity type, first and second main electrodes of which transistor being coupled to the second output terminal and the fourth connecting terminal, respectively, and a control electrode being coupled to the second main electrode.

6. Current divider as claimed in claim 3, characterized in that the second variable current source comprises a transistor of the first conductivity type having first and second main electrodes which are connected to the respective first and second main electrodes of the transistor of the first current memory circuit and having a control electrode connected to the control electrode of the transistor of the first variable current source.

* * * * *